United States Patent [19]
Bahrs et al.

[11] Patent Number: 6,021,259
[45] Date of Patent: Feb. 1, 2000

[54] APPARATUS AND METHOD FOR CONVERSION OF STRUCTURED DATA BETWEEN DIFFERENT FORMATS

[75] Inventors: Peter Carl Bahrs; Krishna Kondaka, both of Boca Raton, Fla.

[73] Assignee: International Business Machines Corporation, Armonk, N.Y.

[21] Appl. No.: 08/898,745

[22] Filed: Jul. 23, 1997

Related U.S. Application Data

[63] Continuation of application No. 08/500,420, Jul. 10, 1995, abandoned.

[51] Int. Cl.[7] .................................................. H04N 7/12
[52] U.S. Cl. ........................... 395/114; 395/116; 358/456
[58] Field of Search .................................... 358/456–457, 358/426–427, 261.1–261.3; 382/299, 232–235; 348/407–408; 395/114–116

[56] References Cited

U.S. PATENT DOCUMENTS

| | | | |
|---|---|---|---|
| 4,849,810 | 7/1989 | Ericsson | 348/416 |
| 4,858,017 | 8/1989 | Torbey | 358/426 |
| 5,121,448 | 6/1992 | Katayama et al. | 382/284 |
| 5,148,272 | 9/1992 | Acampora et al. | 348/397 |
| 5,150,209 | 9/1992 | Baker et al. | 348/407 |
| 5,153,749 | 10/1992 | Katayama et al. | 358/448 |
| 5,155,594 | 10/1992 | Bernstein et al. | 348/411 |
| 5,253,053 | 10/1993 | Chu et al. | 348/384 |
| 5,272,529 | 12/1993 | Frederiksen | 348/422 |
| 5,289,299 | 2/1994 | Paek et al. | 359/29 |
| 5,297,219 | 3/1994 | Weldy | 382/299 |
| 5,315,655 | 5/1994 | Chaplin | 380/4 |
| 5,323,247 | 6/1994 | Parker et al. | 358/456 |

FOREIGN PATENT DOCUMENTS

| | | |
|---|---|---|
| 555048 | 8/1993 | European Pat. Off. . |
| 559376 | 10/1993 | European Pat. Off. . |
| 564227 | 10/1993 | European Pat. Off. . |
| 63-263983 | 10/1988 | Japan . |
| 02177766 | 7/1990 | Japan . |
| 05183894 | 7/1993 | Japan . |

OTHER PUBLICATIONS

"PowerPC Reference Platform Specification VI.1," IBM. Sep. 1994.
"PowerPC 601 RISC Microprocessor User's Manual." IBM Microelectronics. Rev. 1.0. 1993, Ch. 2, pp. 47–49 and Ch. 3 p. 49.
"How to Create Endian Neutral Software for Portability." IBM Technical Report TR 54.837. Mar. 31, 1994.
"Data Structure and Algorithms." Addison–Wesley Publishing Company. Apr. 1987. Chapters 3, 4.6 and 9.

*Primary Examiner*—Thomas D. Lee
*Assistant Examiner*—Stephen Brinich
*Attorney, Agent, or Firm*—Romualdas Strimaitus; Mark Walker; Andrea Pair Bryant

[57] ABSTRACT

Apparatus and method for performing hierarchial type mask encoding and data transformation includes locating a data source, loading the data source into a temporary storage, encoding hierarchical heuristics for buffer transformation, and delivery of data for transformation and scalar type encoding, reduction, compression, iteration, type extension and versioning if required.

4 Claims, 4 Drawing Sheets

APPARATUS AND METHOD FOR CONVERSION OF STRUCTURED DATA BETWEEN DIFFERENT FORMATS

This application is a continuation of application Ser. No. 08/500,420 filed on Jul. 10, 1995, which was abandoned upon the filing hereof.

BACKGROUND OF THE INVENTION

1. Field of the Invention

The present invention relates to information handling systems, and more particularly to information handling systems in which data exist in a number of different formats which must be transformed for use in the information handling system.

2. Prior Art

U.S. Pat. No. 4,849,810, entitled "Hierarchial Encoding Method and Apparatus for Efficiently Communicating Image Sequences", teaches a method and apparatus for encoding interframe error data in an image transmission system, and in particular in a motion compensated image transmission system for transmitting a sequence of image frames from a transmitter to a receiver, and play hierarchial vector quantitization and arithmetic coding to increase the data compression of the images being transmitted.

The patent deals only with binary images and successive images and is used primarily for reducing error proximtions and playing back images. The patent does not teach a hierarchy that is data type oriented, does not include reduction, iteration, nor type compression, nor does it teach versioning or type extension.

U.S. Pat. No. 5,155,594, entitled "Hierarchial Encoding Method and Apparatus Employing Background References for Efficiently Communicating Image Sequences", teaches a method and apparatus for transmitting a sequence of image frames by encoding interframe error data. The patent teaches the steps of compiling a spacially decomposed image of a background of the sequence of image frames, spacially decomposing a warped image of a previous frame, and spacially decomposing a new input image. The spacially decomposed input image is compared with the spacially decomposed background image and the spacially decomposed warped image. An error signal defining the spacially decomposed input image is generated based on these comparisons. The '594 patent is an extension of the '810 patent discussed above. The limitations of the '810 patent apply equally tot he '594 patent.

U.S. Pat. No. 4,858,017, entitled "System and Method for Hierarchial Image Encoding and Decoding", teaches hierarchial encoding of an image by deriving a picture element array of binary coded intensity values representing the image and then deriving from the intensity values of the picture element array a sequence hierarchial codes consisting of one of the intensity values as the first code followed by n−1 cyclic differences between n−1 distinct pairs of intensity values, where n is the total number of intensity values of the picture element array.

The patent deals with image compression and Huffman encoding and does not include data type oriented hierarchy, nor does it include reduction, iteration or type compression.

U.S. Pat. No. 5,297,219, entitled "Transforms for Digital Images in an Hierarchial Environment", teaches an image processing system which transforms higher resolution images to lower resolution images.

Byte oriented data hierarchy only captures redundant resolution. The hierarchy is not data type oriented and does not include reduction, iteration or type compression and further does not provide versioning or type extensions.

U.S. Pat. No. 5,150,209, entitled "Hierarchial Entropy Coded Lattice Threshold Quantitization Encoding Method and Apparatus for Image and Video Compression", teaches method and apparatus for encoding interframe error data in an image transmission system, and in particularly in a motion compensated image transmission system for transmitting a sequence of image frames from a transformer to a receiver, including hierarchial entropy coded lattice threshold quantitization to increase the data compression of the images being transmitted.

As above, the '209 patent only deals with image compression and does not include a data type oriented hierarchy, nor does it include reduction, iteration or type compression.

U.S. Pat. No. 5,148,272, entitled "Apparatus for Recombining Prioritized Video Data", decodes a high definition television signal conveyed as high and low priority data in high and low priority channels, respectively, wherein the high and low priority data originated from blocks of hierarchial encoded compressed video data with data of greater importance for image reproduction of each block allocated to the high priority channel and the remaining data from each block allocated to the low priority channel.

Although the '272 patent deals with encoding hierarchically encoded data, it does not include reduction, iteration, type compression, nor does it provide for versioning or type extension.

U.S. Pat. No. 5,121,448, entitled "Method and Apparatus for High Speed Editing of Progressively Encoded Images", teaches an image editing method and apparatus wherein low resolution image data among hierarchically encoded image data are decoded. The decoded low resolution image data are subjected to editing, editing data representative of the editing are stored, the hierarchically encoded image data are decoded to obtain original image data, and the decoded original image data are subjected to the editing in accordance with the stored editing data.

The patent deals with replaying of an image and does not include a hierarchy which is data type oriented, nor does it include reduction, iteration or type compression nor versioning or type extension U.S. Pat. No. 5,153,749, entitled "Image Encoding Apparatus", teaches an image encoding apparatus which includes a conversion circuit for converting binary images into multivalue image data.

As with some of the other prior art patents discussed above, the '749 patent deals with bit level binary image data and does not deal with a hierarchy which is data type oriented, nor does it include reduction, iteration, type compression, versioning or type extension.

U.S. Pat. No. 5,315,655, entitled "Method and Apparatus for Encoding Data Objects on a Computer System", teaches a method and apparatus for real time encoding and decoding of data on a computer system. The patented apparatus or method is used with a utility which causes data objects to be encoded and decoded. The utilities include data compression utilities, data encryption utilities, and security utilities. The patented method involves the steps of opening encoded data object, starting operation of an encoding/decoding apparatus, encoding a decoded data object from a list of decoded data objects, removing the decoded data object from the list of decoded data objects, decoding the encoded data object, posting the encoded data object to a list of decoded data objects, and invoking an application associated with the data object just decoded.

The patent refers to a document architecture hierarchy. However, the patent does not provide reduction, compression, iteration, type extension, and versioning.

The prior art described above does not provide for a hierarchial type mask encoding and transformation for data and instructions in mixed formats.

SUMMARY OF THE INVENTION

Therefore, it is an object of the present invention to efficiently convert data and instructions in mixed formats with a mechanism for transformation and encoding which supports scalable types, versioning, dynamic type encoding, reduction, compression and iteration while maintaining minimum storage requirements and maximum system performance.

Accordingly, apparatus and method for performing hierarchial type mask encoding and data transformation includes locating a data source, loading the data source into a temporary storage, encoding heuristics for buffer transformation, and delivery of data for transformation and scalar type encoding, reduction, compression, iteration, type extension and versioning if required.

The method and apparatus according to the present invention is very powerful and general and allows data in many varied formats to be effectively encoded and transformed and used in a single data processing system.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which.

DETAILED DESCRIPTION OF A PREFERRED EMBODIMENT OF THE INVENTION

A family of computers based on the PowerPC allows for single and mixed Endian modes of operation. (See Gillig, *How to Create Endian Neutral Software for Portability*, IBM Technical Report 54.837.) Sources of data and programs in operating systems, firmware, residual data, non-volatile RAM ("NVRAM") and applications can be in single and mixed Endian formats. The present invention as embodied herein provides transforms of scalar and aggregate data types between the various sources. The present invention as embodied herein is general: the same mechanism for residual data and NVRAM to operating systems conversions can be used between operating systems and cross address space communication. The present invention as embodied herein is flexible: repetitive and iterative data aggregates are handled. The present invention as embodied herein is efficient: short paths to iteration and repetition reduce unnecessary time and resources in the conversion. The present invention as embodied herein is extensible: versioning is dynamic type encoding is possible.

The present invention as embodied herein executes independent of addressing modes, is shared in the microkernel services, shared services, operating systems, embedded systems, and other non-PowerPC architectures.

Overview

Two primary sources of data exists in PowerPC: hardware and software.

Hardware data sources include:
 1. NVRAM
 2. ROM
 3. Residual Data
 4. Firmware in the form of Run-time and Open Firmware programming interfaces
 5. System Memory Software data sources include:
 1. Operating system components and applications
 2. Local and remote messaging
 3. File and date formats In mixed Endian programming environments, transformations of mixed data formats is more common. Transformation steps include locating data source, loading data source into a buffer, encoding heuristics for buffer transformation and delivery of data source. Specifically illustrated in this document are the encoding and transformation. Location and delivery mechanism are implementation or domain dependent.

Figure 1:
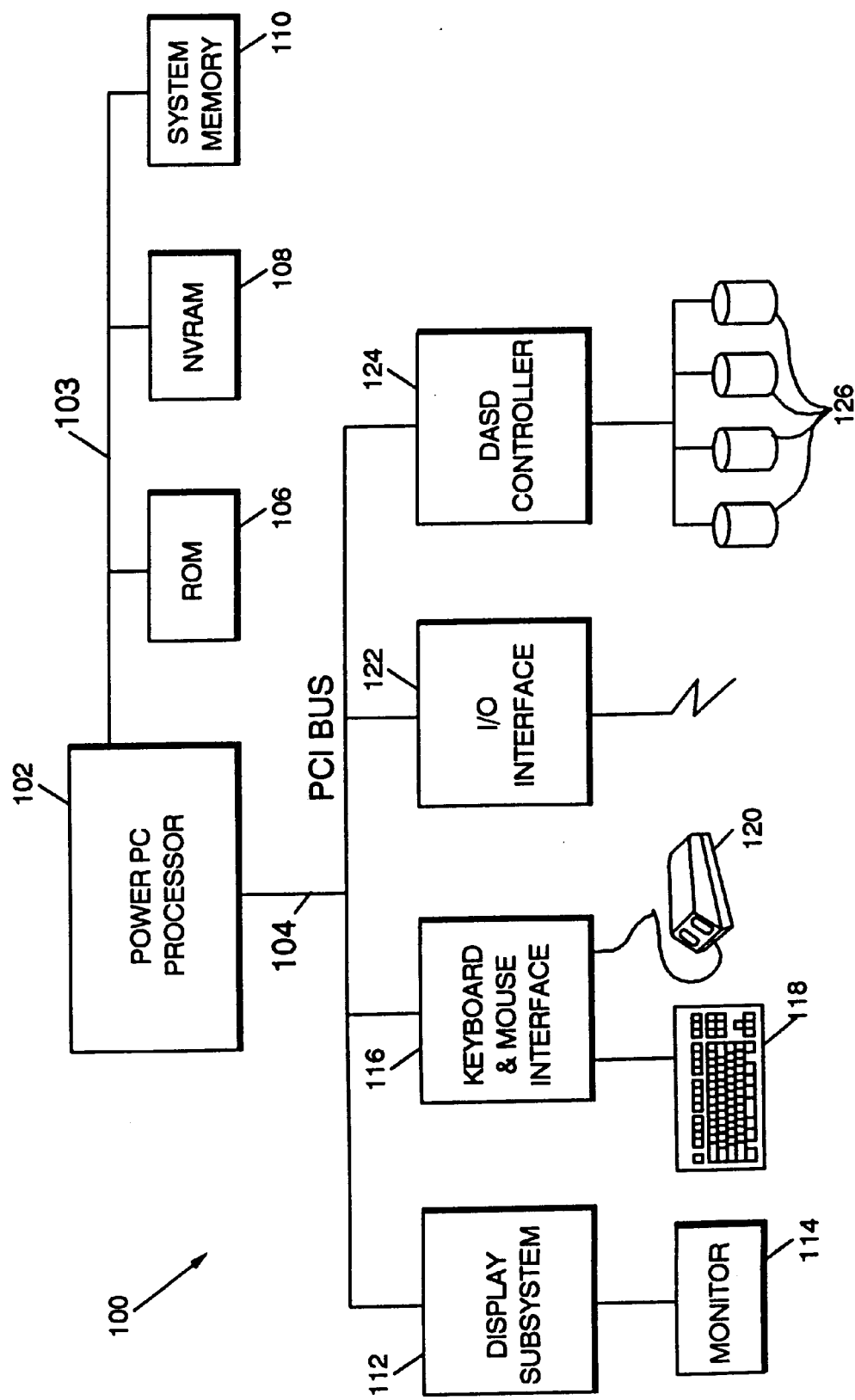
FIG. 1 is a block diagram of a data processing system implementing the present invention.

Referring now to FIG. 1, a data processing system 100 embodying the present invention will be described. Processor 102 which preferably is a PowerPC processor is connected to a storage bus 103 and an input/out bus 104. Storage bus 103 also connects to a read only memory 106, a nonvolatile random access memory (NVRAM) 108, and system memory 110.

The firmware referred to above may be stored in read only memory 106, NVRAM 108, or it may be loaded into system memory 110. Operating system components and applications are stored in system memory 110.

PCI bus 104, which has become an industry standard for personal computer input/output interfaces, connects processor 102 to a number of user and peripheral device controllers. Display subsystem 112 connects to PCI bus 104 and provides text and graphics data to monitor 114. A keyboard and mouse interface controller 116 controls inputs from keyboard 118 and mouse 120 to PCI bus 104. I/O interface 122 connects to remote devices such as a communications line or the like. DASD controller 124 connects between PCI bus 104 and a number of direct access storage devices 126 where portions of orating systems and applications and data not in current use by processor 102 are stored.

Figure 2:
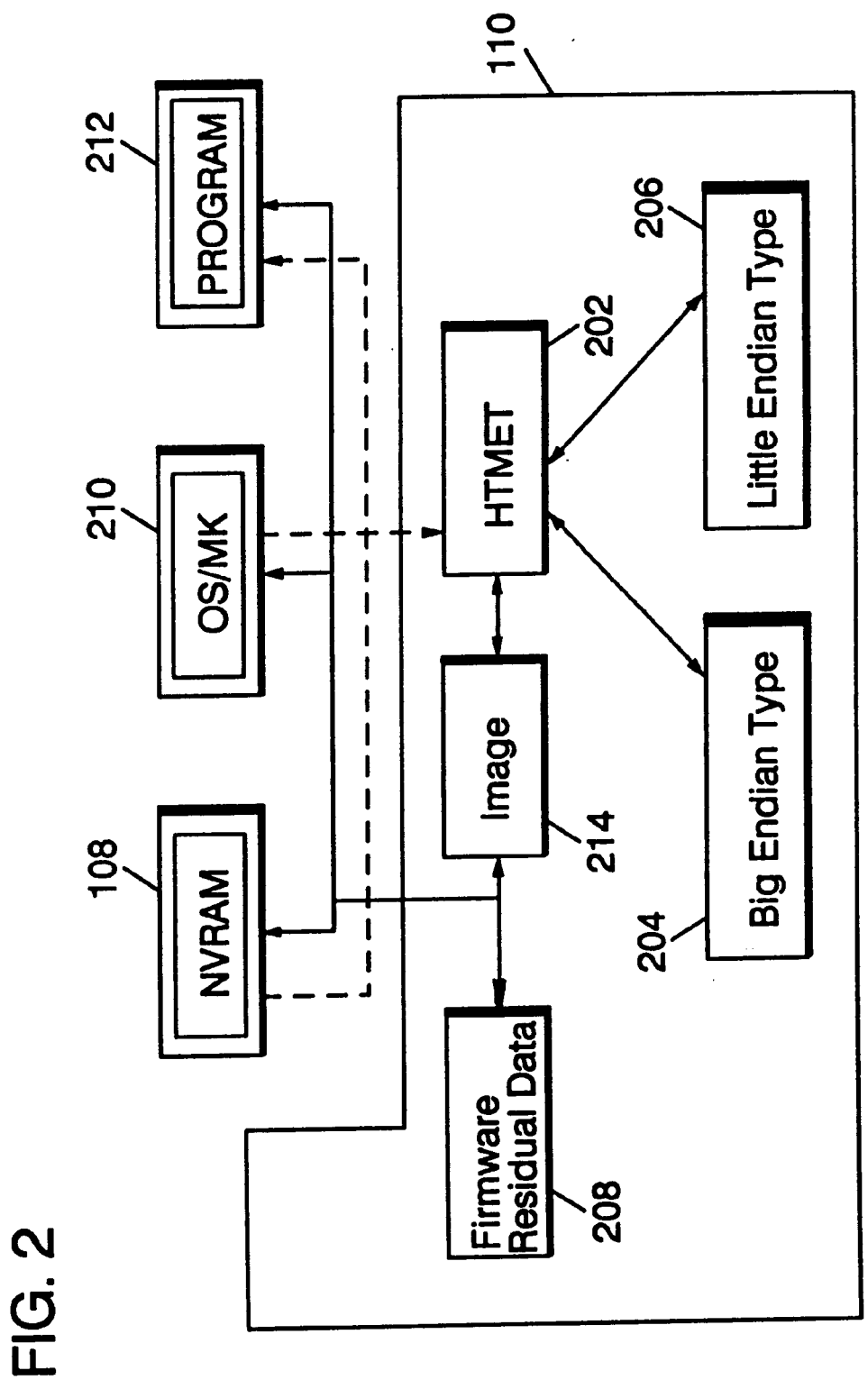
FIG. 2 is a diagram of system memory layout including a mechanism for executing the method according to the present invention.

Referring now to FIG. 2, the storage of program information and data in NVRAM 108 and system memory 110 will be described in greater detail.

As discussed above, data may be in mixed Endian formats. Typically, these data are referred to as big Endian type and little Endian type as described in the Gillig paper referenced above.

Referring now to FIG. 2, various components stored in system memory 110 will be described. Hierarchial type mask encoding and transform module (HTMET) 202 is a key element of the preferred embodiment of the present invention. Data in big Endian type 204 and data in little Endian type 206 is encoded and/or transformed by HTMET 202 to a format consistent with the format used in the processor 102. Firmware residual data module 208 provides data to the NVRAM 108, to the operating system module 210, to the program module 212 and to the image module 214. HTMET 202 communicates with image module 214 and with NVRAM 108, operating system module 210 and program module 212.

Type Mask Encoding

The encoding mechanisms are design for minimal storage and optimal performance. They include:

1. Scalar Type Encode (STE): 1 to 1 mapping between data and encoding scalar types.

2. Reduction: Reducing aggregate type by replacing each aggregate component with STEs.

3. Compression: Successive similar aggregates or scalars are compressed into single count encoded STEs.

4. Iteration: Successive patterns of different aggregates or scalars are encoded as iterative patterns of compressions, reductions and STEs.

5. Type Extension: Defined types or aggregates can be maintained (not Reduced) through extension of the STE encoding sequence, producing a hierarchy of type mask encodings (HTME).

6. Versioning: Various versions of HTME can be encoded in an HTME.

Scalar Type Encode

Premise: for each scalar (base) type, the sizes in bytes are implementation specific; the size will not affect the proposal.

Premise: for notational convenience, the data or image is characterized as a series of types in a structure STRUCT.

1. For each of the $2^K$ scalar types, assign a bit field encoding (i.e. 8 types $\Rightarrow$ k=3).

2. For each scalar type S in STRUCT, form a K bit mask component encoding S. Maintain a precise order from S's position in STRUCT.

Scalar Type Encode: (STE)

D = storage for encoding

| K Bits | K Bits |
|---|---|
| SCALAR TYPE ENCODE | SCALAR TYPE ENCODE |

1. SCALAR TYPE ENCODE $\in$ S:= {char, short, int, float, long, double, etc.}

2. $|S| \le 2^K$

3. $|D|$ = storage = (number of scalars in STRUCT) * K

Reduction

Simple Reduction:

1. For each simple aggregate (all scalars) type A, reduce A to scalars then STE.

Simple Reduction: (sR)

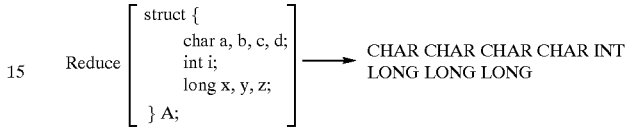

Reduction:

1. For each complex aggregate type $A_{complex}$ build linear ordering as:
2. For each simple aggregate perform a Simple Reduction
3. For each scalar perform an STE
4. For each complex aggregate perform a Reduction Reduction: (R)

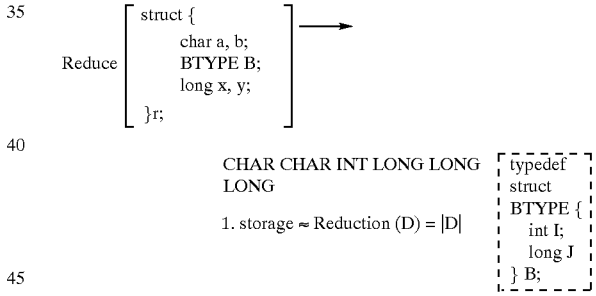

1. storage $\approx$ Reduction (D) = $|D|$

Reduction is used when aggregate types are unique to a version. For multi-version encoding, skipping a reduction in-line can decrease storage as versions can point to out-of-line reduction.

Compression

For the set P composed of tuples $(scalar_i, scalar_j)$: $i \in S$:= {scalar types}, compress tuple to $(scalar_i 2)$. The extends for any series of T tuples $(scalar_{i1}, scalar_{i2}, \ldots, scalar_{iT})$ with $(scalar_i T)$.

Compression: (C)

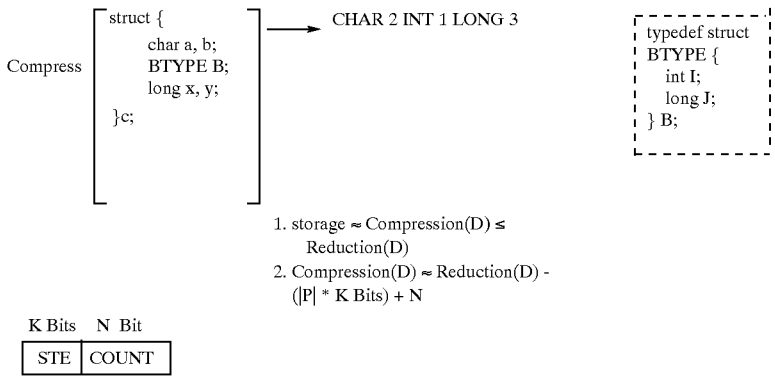

Compression encoding also enables the ability to 'skip' a series of data. For example, in the case of CHAR, BE(CHAR)=LE(CHAR), where BE and LE are transforms on CHAR. Thus CHAR N can signal a skip of N scalars of type CHAR, a potential transform time savings O(N).

Iteration

It is common for an aggregate data type A to be composed of patterns of types. If a pattern $P_a$ is in A, and a similar pattern $P_b$ follows in A, and if $P^{encode}_i$=Compression (Reduction(STE($P_i$))), replace the pair ($P_a^{encode}$ $P_b^{encode}$) with (ITERATE 2 $P_a^{encode}$). This extends for any series of T patterns to (ITERATE T $P_a^{encode}$).

Iteration: (I)(shown with R)

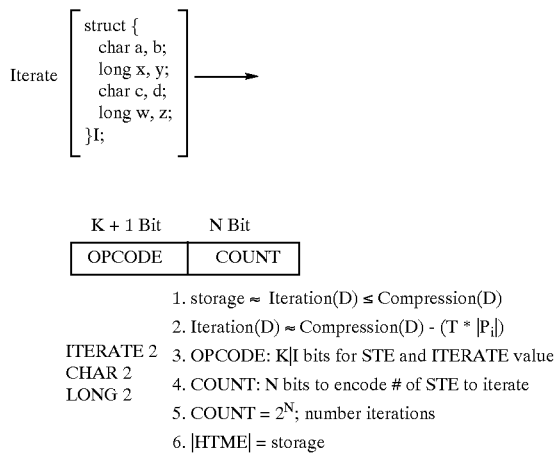

Type Extension

For the set of defined types T, it is possible to supplement the OPCODE with new encoding by increasing the size of K to K+|T|. An OPCODE above those defined for Iteration are references to additional types (HTMEs). The number of additional type is $2^{k+|T|}$. The Iteration COUNT still applies. The level of sub references is conceptually infinite but in practice is finite and is an indication of the complexity of a program. Type extension forms the HIERARCHY in the Date Type Encoding Mask.

Type Extension: (TE)

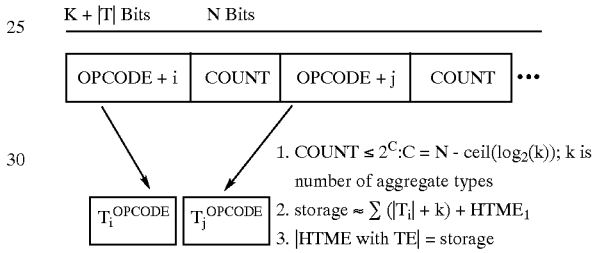

The converse of type extension (out-of-line encoding) is in-line encoding. In this case, no additional types are encoded and referenced in the HTME. All encoding results in a linear flattened series of base scalar types. There are cases where type extension is very useful.

Versioning

Figure 3:
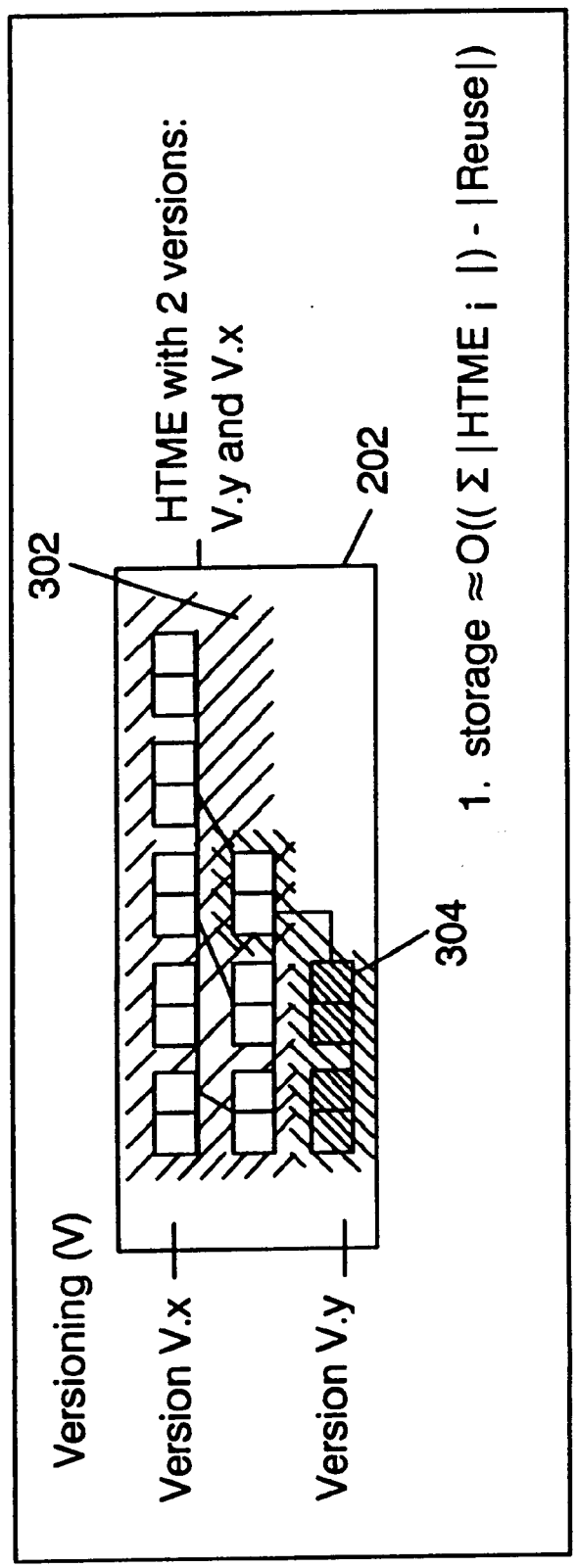
FIG. 3 is a block diagram of the versioning process in accordance with the present invention.

Referring now to FIG. 3, a block diagram showing hierarchical-type mask encoding with two versions will be described.

A first version V.x 302 in HTMET 202 has an initial entry created in HTMET 202. A second version V.y 304 is added in HTMET 202 with connection to components of version V.x 302 for reuse of components in version V.x 302. The versioning created in accordance with the preferred embodiment of the present invention is efficient in processor time and storage since reuse of common components reduces processing time and additional storage.

For each version V required of an HTME (possibly wit TE):

1. Create an initial entry into the existing HTME

2. Re-use components where applicable

3. Add components where applicable

As indicated in "Reduction of Aggregate Types", the choice of in-line reduction versus out-of-line reduction is a performance and storage trade-off. For example consider s and t below. If |SIZE|<ε, then Reduce in-line, otherwise Reduce out-of-line and add references.

In-line vs. Out-of-line Reduction

```
struct {            struct {
    int a;              char a, b, c;
    SIZE L;             SIZE L;
    long c;             Mem m;
} s;                } t;
        INT 1 HTME (L) LONG 1
                 vs.
        CHAR 3 L-OPCODE 1 HTME (M) 1
```

Transform

A transformation HTMET on data (data or instructions) D is:

HTMET (D)≈T (HTME (D))≈T (STE(C(I(R|sR(TE(V (D))))))) such that T is of the form:

```
1.   For each version V in HTMET(D)
2.     For each d in V
3.       if d is a scalar // STE, R, or C encoding as base types
4.         // implementation specific for size and hardware support
5.         do byte reversals
6.       if d is a TE
7.         locate TE offset and do T(d) at 2
8.       if d is an Iteration
9.         for |d's encoding of ITERATE|
10.          do T(i) : i is one of the next d's COUNT encodings
```

The implementation specific byte re-ordering is characterized by the base scalar types in an HTME. In the typical case, scalars are converted as described in *PowerPC 601 RISC Microprocessor User's Manual.* IBM Microelectronics. Rev 1.0. 1993., and, *PowerPC Reference Platform Specification V*1.1., IBM September 1994. The mechanisms to perform the re-ordering can be a software algorithm or can have hardware assistance, such as lwbrx or lwarx. For computers where the notion of base scalar types and Endian transformations are different, a replacement of the implementation byte re-ordering mechanism is needed.

Figure 4:
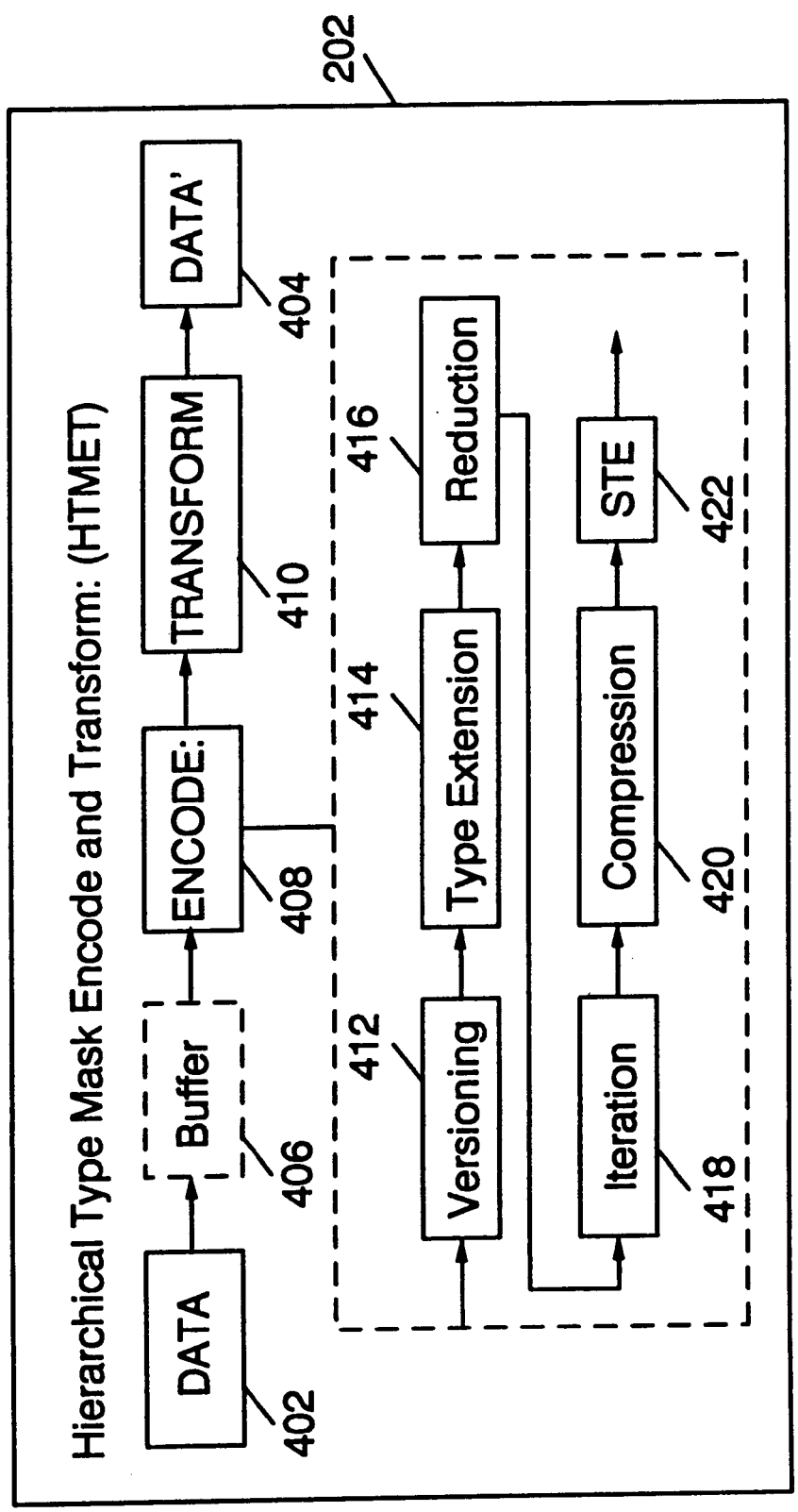
FIG. 4 is a block diagram of the components of the method according to the present invention.

Referring now to FIG. 4, the components of HTMET 202 will be described in greater detail.

HTMET 202 encodes and/or transforms data 402 to data prime 404 which is the encoded and transformed version of data 402. Data 402 may be buffered in buffer 406 prior to the hierarchical-type mask encoding in encoder 408. After encoding, an encoder 408, which will be further described with reference to its component modules, the encoded data is transformed by transform module 410 as described above with the output being data prime 404.

The modules which are included in type mask encoding in encoder 408 are all modules which have been described above in this specification. These modules include versioning 412, type extension 414, reduction 416 which may include standard reduction and simple reduction, iteration 418, compression 420, and scalar-type encoding (STE) 422.

Although the present invention and its advantages have been described in detail, it should be understood that various changes, substitutions and alterations can be made herein without departing from the spirit and scope of the invention as defined by the appended claims.

What is claimed is:

1. A data processing system, comprising:

a processor, for processing instructions and data;

a storage subsystem, for storing instructions and data for use in said processor, said storage subsystem comprising a hierarchical type mask encoding and transform module, wherein the hierarchical type mask encoding and transform module is used for encoding and transforming data in a first data format having a hierarchical data structure to a second encoded data format that preserves said hierarchical data structure for use in said processor; and an input-output subsystem for controlling interaction between said processor, said storage subsystem and peripheral devices.

2. A data processing system, according to claim 1, wherein said storage subsystem further comprises:

one or more storage areas for storing data in said first format; and one or more storage areas for storing data in said second format.

3. A data processing system, according to claim 1, wherein said hierarchical type mask encoding and transform module includes a plurality of transforms and wherein said storage subsystem further comprises:

means for detecting said hierarchical data structure; and means for selectively applying zero, one, or more of said plurality of transforms to said first data format in response to said first data format structure.

4. A data processing system, according to claim 1, wherein said input-output subsystem further comprises:

one or more controllers for controlling command and data flow between said processor, said storage subsystem and said peripheral devices.

\* \* \* \* \*